(12) United States Patent
Takano

(10) Patent No.: US 6,545,348 B1
(45) Date of Patent: Apr. 8, 2003

(54) PACKAGE FOR A SEMICONDUCTOR DEVICE COMPRISING A PLURALITY OF INTERCONNECTION PATTERNS AROUND A SEMICONDUCTOR CHIP

(75) Inventor: Terunari Takano, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/520,784

(22) Filed: Mar. 8, 2000

(30) Foreign Application Priority Data

Mar. 12, 1999 (JP) .......................... 11-066299

(51) Int. Cl.[7] .................. H01L 23/52; H01L 23/48; H01L 23/495
(52) U.S. Cl. .................. 257/691; 257/666; 257/696; 257/698; 257/695; 257/670; 257/678; 257/783; 257/775; 257/776; 257/664; 257/784; 361/792; 361/794; 361/704; 361/690; 174/252; 174/235
(58) Field of Search .................. 257/678, 691, 257/692, 700, 701, 784, 786, 783, 774, 680, 697, 696, 698, 687, 758, 668, 775, 776, 464; 361/792, 794, 704, 690, 719, 761, 724, 777; 174/252, 235

(56) References Cited

U.S. PATENT DOCUMENTS

| | | | |
|---|---|---|---|
| 5,311,058 A | | 5/1994 | Smolley ...................... 257/691 |
| 5,483,099 A | * | 1/1996 | Natarajan et al. ........... 257/691 |
| 5,502,278 A | * | 3/1996 | Mabboux et al. ........... 257/691 |
| 5,672,909 A | | 9/1997 | Glenn et al. ................. 257/468 |
| 5,798,571 A | | 8/1998 | Nakajima ..................... 257/784 |
| 5,818,102 A | * | 10/1998 | Rostoker ..................... 257/666 |
| 5,895,967 A | * | 4/1999 | Stearns et al. .............. 257/691 |
| 5,903,050 A | * | 5/1999 | Thurairajaratnam et al. ..... 257/691 |
| 5,936,303 A | * | 8/1999 | Nishi .......................... 257/691 |
| 6,064,113 A | * | 5/2000 | Kirkmsn ..................... 257/691 |
| 6,114,749 A | * | 9/2000 | Chia ........................... 257/666 |
| 6,194,786 B1 | * | 2/2001 | Orcutt ......................... 257/784 |

* cited by examiner

Primary Examiner—Alexander O. Williams
(74) Attorney, Agent, or Firm—Finnegan, Henderson, Farabow, Garrett & Dunner, L.L.P.

(57) ABSTRACT

A first interconnection pattern having a comb shape is formed around a semiconductor chip on a package body. A second interconnection pattern having a comb shape is formed around the first interconnection pattern. The projections of the first interconnection pattern are engaged with the projections of the second interconnection pattern. The distances between those two groups of projections and the bonding pads of the semiconductor chip are set nearly equal to each other.

18 Claims, 5 Drawing Sheets

US 6,545,348 B1

PACKAGE FOR A SEMICONDUCTOR DEVICE COMPRISING A PLURALITY OF INTERCONNECTION PATTERNS AROUND A SEMICONDUCTOR CHIP

CROSS-REFERENCE TO RELATED APPLICATION

This application is based upon and claims the benefit of priority from the prior Japanese Patent Application No. 11-066299, filed Mar. 12, 1999, the entire contents of which are incorporated herein by reference.

BACKGROUND OF THE INVENTION

The present invention relates to a package for, for example, a semiconductor device, and, more particularly, to a plastic package using a multilayer substrate.

FIG. 10 shows a conventional package for a semiconductor device, for example, a PPGA (Plastic Pin Grid Array) package. A semiconductor chip 102 is located at the center portion of a plastic package body (hereinafter called "package body") 101 comprising a multilayer substrate. Formed on the package body 101 around the semiconductor chip 102 is a first interconnection pattern 103 to which, for example, a ground potential is supplied. Formed around the first interconnection pattern 103 is a second interconnection pattern 104 to which, for example, a power supply potential is supplied. A plurality of bonding pads 105 as signal input/output leads are laid around the second interconnection pattern 104, and a plurality of pads 106 are laid around those bonding pads 105. Those pads 106 are connected to the first and second interconnection patterns 103 and 104 and the bonding pads 105 by wires (not shown).

FIG. 11 is a cross-sectional view along the line 11—11 in FIG. 10. As shown in FIG. 11, the first and second interconnection patterns 103 and 104 are connected to a plurality of grounding bonding pads (not shown) and a power-supply bonding pad (not shown) by bonding wires 111 and 112. This connection of the first and second interconnection patterns 103 and 104 to the grounding bonding pads provided on the semiconductor chip 102 is made to supply a stable ground potential and power-supply potential to the semiconductor chip 102. The bonding pads 105 are connected by bonding wires 113 to signal bonding pads (not shown) that are laid around the semiconductor chip 102.

As apparent from FIGS. 10 and 11, the conventional package for a semiconductor device has the first and second interconnection patterns 103 and 104 and the plurality of pads 106 arranged concentrically around the semiconductor chip 102. The distances between the bonding pads of the semiconductor chip 102 and the first and second interconnection patterns 103 and 104 and the pads 106 naturally differ from one another. This necessitates that the bonding wires 111, 112 and 113 which respectively connect the first and second interconnection patterns 103 and 104 and the pads 106 to the bonding pads of the semiconductor chip 102 have different loops. That is, the conventional package for a semiconductor device requires three types of bonding loops be designed.

The conventional structure uses the three types of bonding wires 111, 112 and 113 of different lengths. If the number of bonding wires is increased, therefore, the bonding wires are likely to contact one another, producing defects.

Further, the use of multiple long bonding wires increases the resistance and inductance of the wires. This reduces the transfer speed for high-frequency signals and thus degrades the characteristics of the semiconductor chip 102.

Furthermore, as the first and second interconnection patterns 103 and 104 are laid out linearly around the semiconductor chip 102, the first and second interconnection patterns 103 and 104 do not have distinctive shapes. This leads to a lower precision of the position detection by the bonding machine at the time of wire-bonding the first and second interconnection patterns 103 and 104.

BRIEF SUMMARY OF THE INVENTION

Accordingly, it is an object of the present invention to provide a package for a semiconductor device, which reduces the number of kinds of loop designs for bonding wires, prevent degradation of the electric characteristics and improve the alignment precision at the time of wire-bonding.

To achieve the above object, according to one aspect of this invention, there is provided a package for a semiconductor device comprising a substrate having a center portion on which a semiconductor chip is to be mounted; a first interconnection pattern formed on the substrate at a position around the semiconductor chip and having a continuous first interconnection main portion and a plurality of first projections protruding from the first interconnection main portion at approximately equal intervals; and a second interconnection pattern formed on the substrate at a position around the semiconductor chip and apart from the first interconnection pattern by a predetermined distance and having a continuous second interconnection main portion and a plurality of second projections so formed as to protrude from the second interconnection main portion at approximately equal intervals and to be engaged with the first projections of the first interconnection pattern in a non-contact manner.

The first and second projections of the first and second interconnection patterns are provided at approximately equal distances from a periphery of the semiconductor chip.

The base portions of the first and second projections of the first and second interconnection patterns may be rounded.

According to the second aspect of this invention, there is provided a package for a semiconductor device comprising a substrate having a center portion on which a semiconductor chip is to be mounted; a first interconnection pattern formed on the substrate at a position around the semiconductor chip and having a continuous first interconnection main portion and a plurality of first projections protruding from the first interconnection main portion at approximately equal intervals; a second interconnection pattern formed on the substrate at a position around the semiconductor chip and apart from the first interconnection pattern by a predetermined clearance and having a continuous second interconnection main portion and a plurality of second projections so formed as to protrude from the second interconnection main portion at approximately equal intervals and to be engaged with the first projections of the first interconnection pattern in a non-contact manner; and a third interconnection pattern laid between the first and second projections of the first and second interconnection patterns.

The first and second projections of the first and second interconnection patterns are provided at approximately equal distances from a periphery of the semiconductor chip.

The base portions of the first and second projections of the first and second interconnection patterns may be rounded.

According to the third aspect of this invention, there is provided a package for a semiconductor device comprising a substrate having a center portion on which a semiconductor chip is to be mounted; a first interconnection pattern formed on the substrate at a position around the semiconductor chip and having a continuous first interconnection main portion and a plurality of first projections protruding from the first interconnection main portion at approximately equal intervals; and a plurality of second interconnection patterns formed on the substrate at a position around the semiconductor chip and laid between the first projections of the first interconnection pattern.

The first projections of the first interconnection pattern and the second interconnection patterns are provided at approximately equal distances from a periphery of the semiconductor chip.

The base portions of the first projections of the first interconnection pattern may be rounded.

As described above, the present invention provides a package for a semiconductor device, which reduces the number of kinds of loop designs for bonding wires, prevent degradation of the electric characteristics and improve the alignment precision at the time of wire-bonding.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Preferred embodiments of the present invention will now be described with reference to the accompanying drawings.

First Embodiment

Figure 1:
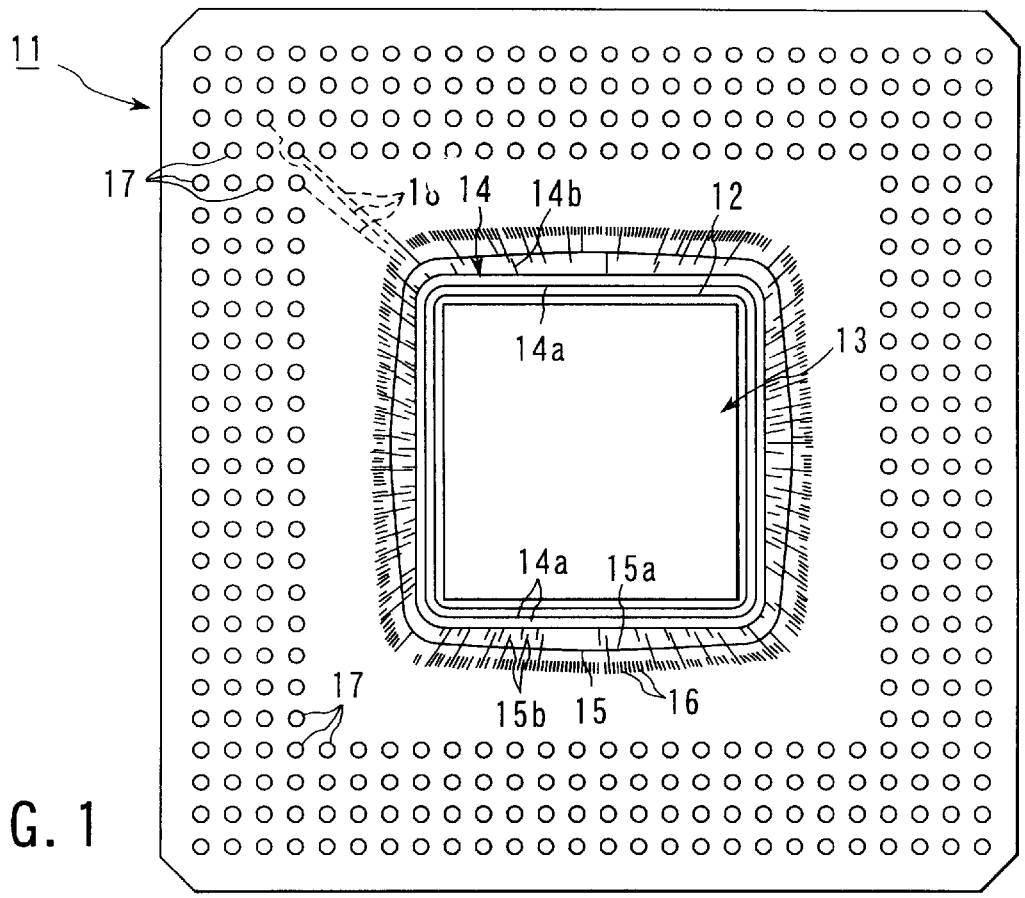
FIG. 1 is a plan view schematically illustrating a first embodiment of this invention.

FIGS. 1 through 4 illustrate a package for a semiconductor device according to the first embodiment of this invention, for example, a PPGA (Plastic Pin Grid Array) package. As shown in FIG. 1, an opening 12 is formed in the center of a package body 11 comprising a multilayer substrate, with a semiconductor chip 13 retained in the opening 12. A first interconnection pattern 14 is formed on the package body 11 around the semiconductor chip 13. The first interconnection pattern 14, which has, for example, a comb shape, comprises a ring-shaped interconnection main portion 14a positioned around the semiconductor chip 13 and projections 14b protruding sideward from the interconnection main portion 14a. A second interconnection pattern 15 is laid around the first interconnection pattern 14 at a predetermined distance therefrom. The second interconnection pattern 15, which has, for example, a comb shape, comprises a ring-shaped interconnection main portion 15a positioned around the first interconnection pattern 14 and projections 15b protruding sideward from the interconnection main portion 15a. The first interconnection pattern 14 is connected to, for example, the ground potential, and the second interconnection pattern 15 is connected to, for example, the power-supply potential.

A plurality of bonding pads 16 are laid on the package body 11 around the second interconnection pattern 15. Those bonding pads 16 are used for, for example, signal input/output to and from the semiconductor chip 13.

A plurality of pads 17 are arranged on the package body 11 around the bonding pads 16. Those pads 17 are connected to the associated first and second interconnection patterns 14 and 15 and the associated bonding pads 16 via an interconnection pattern 18 which is formed in the package body 11.

Figure 2:
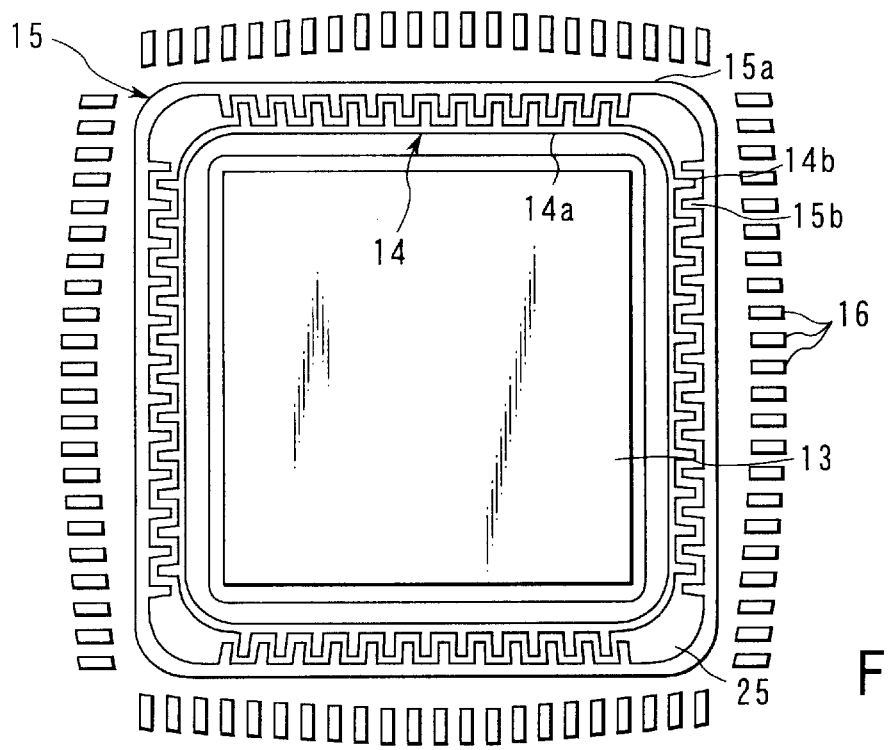
FIG. 2 is a plan view showing the essential portions of what is shown in FIG. 1.
Figure 3:
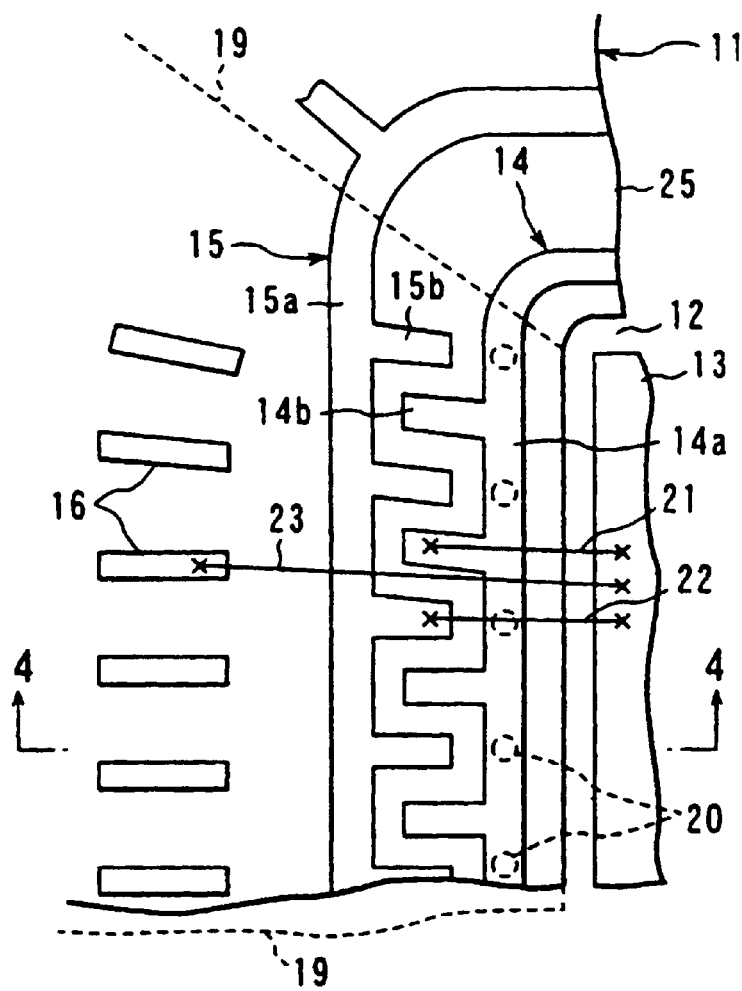
FIG. 3 is a plan view showing the essential portions of what is shown in FIG. 2.

FIG. 2 shows the essential portions of what is shown in FIG. 1 and FIG. 3 depicts the essential portions of what is shown in FIG. 2. As shown in FIGS. 2 and 3, the projections 14b of the first interconnection pattern 14 are engaged with the projections 15b of the second interconnection pattern 15 without having any contact. Those projections 14b and 15b are laid out at approximately equal distances from the bonding portion of the semiconductor chip 13. Between the first and second interconnection patterns 14 and 15 is formed an insulating film 25 of, for example, polyimide. Likewise, an unillustrated insulating film is formed on the surface of the package body 11 at other portions than where the bonding pads 16 and the pads 17 are located.

Figure 4:
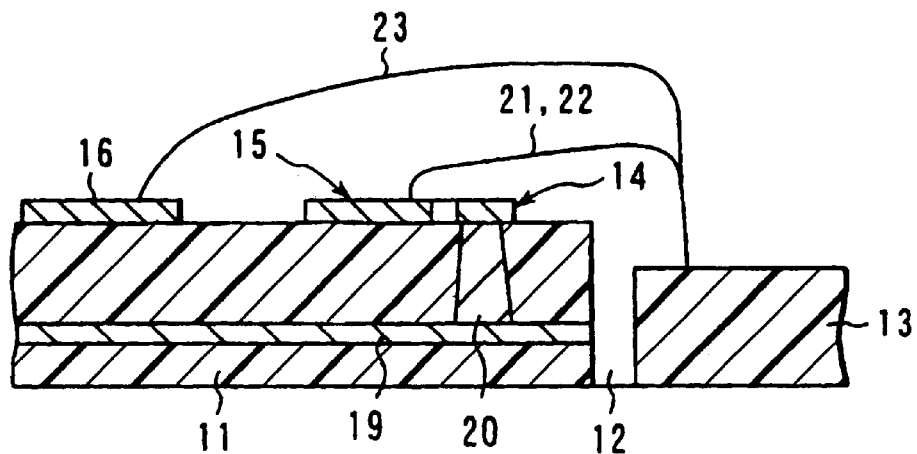
FIG. 4 is a cross-sectional view along the line 4—4 in FIG. 3.

As shown in FIGS. 3 and 4, the interconnection main portion 14a of the first interconnection pattern 14 are connected to another interconnection pattern 19, formed in the package body 11, via a plurality of contact portions 20 which are formed in the package body 11.

In the above-described structures, a plurality of bonding pads (not shown) which are formed on the surface of, and around, the semiconductor chip 13 are connected to the first and second interconnection patterns 14 and 15 and the bonding pads 16 by bonding wires. Specifically, as shown in FIGS. 3 and 4, the projections 14b of the first interconnection pattern 14 are connected to unillustrated associated bonding pads of the semiconductor chip 13 by bonding wires 21, and the projections 15b of the second interconnection pattern 15 to unillustrated associated bonding pads of the semiconductor chip 13 by bonding wires 22. Further, the bonding pads 16 are connected to unillustrated associated bonding pads of the semiconductor chip 13 by bonding wires 23.

In FIG. 3, marks "x" indicate bonding points. As apparent from FIG. 3, the distance from the bonding points of the semiconductor chip 13 to the projections 14b is set nearly equal to the distance from the bonding points of the semiconductor chip 13 to the projections 15b. The difference between those two distances lies within 10% of, for example, the length of the wires. If the difference between those two distances is within 10%, nearly equal to the distance. This can provide the same advantages as the first embodiment. This makes it possible to use the same loop design for the bonding wires 21 and 22. Therefore, the first embodiment uses two kinds of loop designs for the bonding wires: one for the bonding wires 21 and 22 and the other for the bonding wires 23.

According to the first embodiment, the comb-shaped first and second interconnection patterns 14 and 15 are formed on the package body 11 at positions around the semiconductor chip 13, and their projections 14b and 15b are engaged with each other without having any contact. This makes it possible to set the distance between the projections 14b and the associated bonding pads of the semiconductor chip 13 equal to the distance between the projections 15b and the associated bonding pads of the semiconductor chip 13. It is therefore possible to use the same loop design for the bonding wires for connecting the bonding pads of the semiconductor chip 13 to the associated projections 14b and 15b. This structure can therefore require fewer kinds of loop designs than the prior art.

This structure can also shorten the length of the bonding wires that connect the bonding pads of the semiconductor chip 13 to the second interconnection pattern 15 as compared with the prior art. This can shorten the bonding time and speed up the bonding work.

What is more, the shorter bonding wires can reduce contacts between the bonding wires, thus suppressing the production of defects.

Shorting the bonding wires provides such an advantage as to reduce the resistance and inductance of the wires, thus preventing the transfer delay of high-frequency signals which would otherwise affect the performance of the semiconductor chip.

As the projections 14b and 15b of the first and second interconnection patterns 14 and 15 become targets for position detection at the time of bonding, it is possible to improve the precision of position detection of the bonding machine.

Second Embodiment

Figure 5:
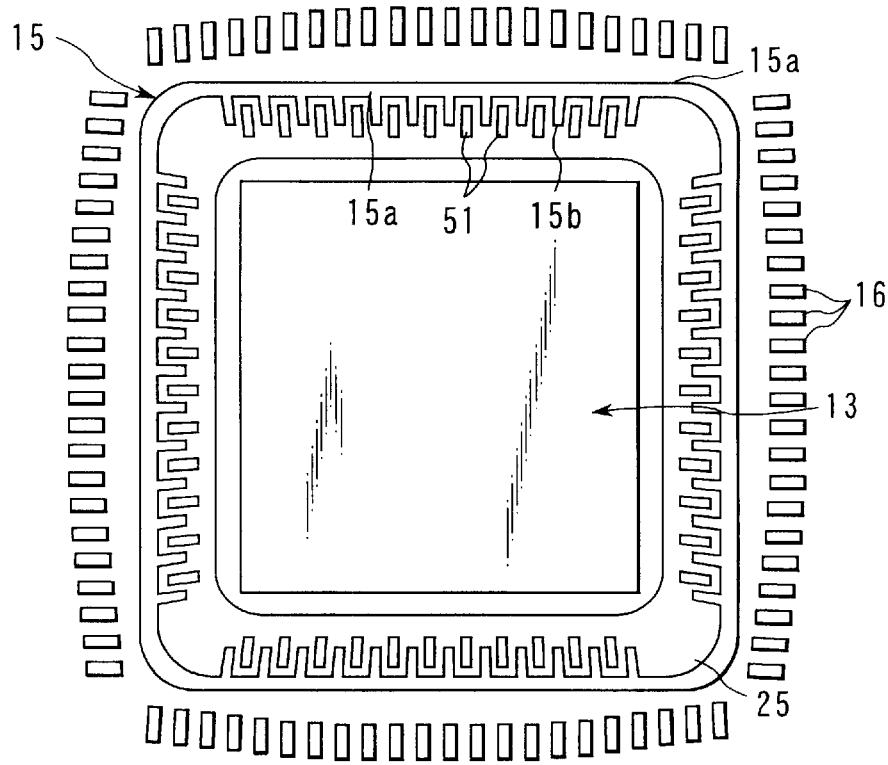
FIG. 5 is a plan view illustrating the essential portions of a second embodiment of this invention.

FIG. 5 illustrates the second embodiment of this invention. Like or same reference numerals are given to those components which are the same as the corresponding components of the first embodiment, and the following discusses only the difference between those embodiments.

According to the second embodiment, a plurality of interconnection patterns 51 are formed at positions corresponding to those of the projections 14b of the first interconnection pattern 14 in the first embodiment. Those interconnection patterns 51 are laid between, and isolated from, the projections 15b of the second interconnection pattern 15. The interconnection patterns 51 are connected to the interconnection pattern 19 formed in the package body 11 via the contact portions 20 as in the structure shown in FIG. 4.

The second embodiment makes it possible to set the distance between the individual interconnection patterns 51 and the associated bonding pads of the semiconductor chip 13 equal to the distance between the projections 15b of the second interconnection pattern 15 and the associated bonding pads of the semiconductor chip 13. It is therefore possible to use the same loop design for the bonding wires that are connected to the interconnection patterns 51 and the bonding wires that are connected to the projections 15b. This can provide the same advantages as the first embodiment.

Third Embodiment

Figure 6:
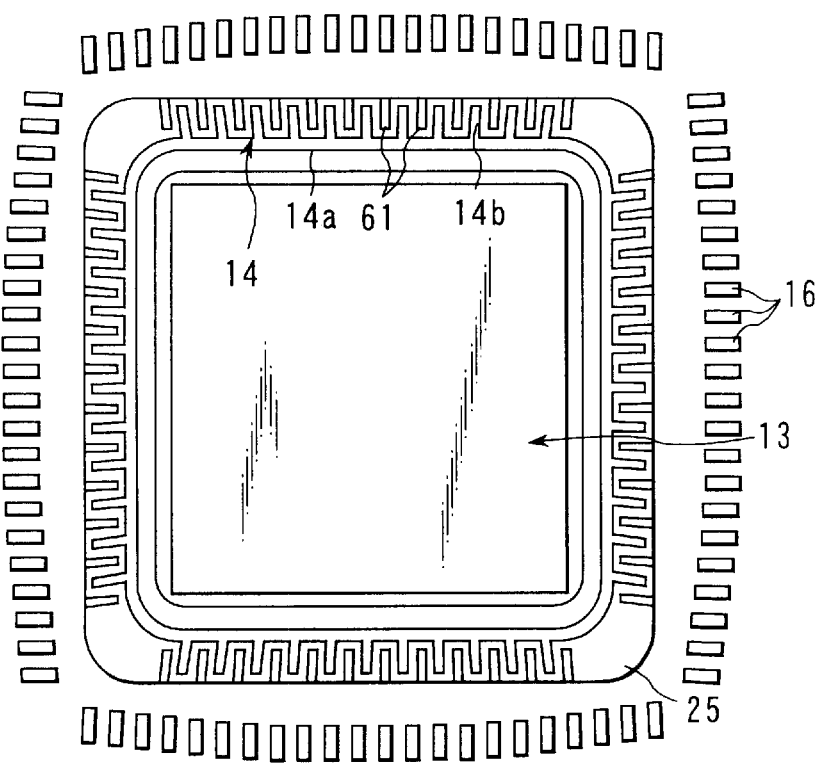
FIG. 6 is a plan view showing the essential portions of a third embodiment of this invention.

FIG. 6 illustrates the third embodiment of this invention. Like or same reference numerals are given to those components which are the same as the corresponding components of the first embodiment. According to the third embodiment, a plurality of interconnection patterns 61 are formed at positions corresponding to those of the projections 15b of the second interconnection pattern 15 in the first embodiment as opposed to the interconnection patterns 51 of the second embodiment. Those interconnection patterns 61 are laid between, and isolated from, the projections 14b of the first interconnection pattern 14. The interconnection patterns 61 are connected to the interconnection pattern 19 formed in the package body 11 via the contact portions 20 as in the structure shown in FIG. 4.

The third embodiment makes it possible to set the distance between the individual interconnection patterns 61 and the associated bonding pads of the semiconductor chip 13 equal to the distance between the projections 14b of the first interconnection pattern 14 and the associated bonding pads of the semiconductor chip 13. It is therefore possible to use the same loop design for the bonding wires that are connected to the interconnection patterns 61 and the bonding wires that are connected to the projections 14b. This can provide the same advantages as the first embodiment.

Fourth Embodiment

Figure 7:
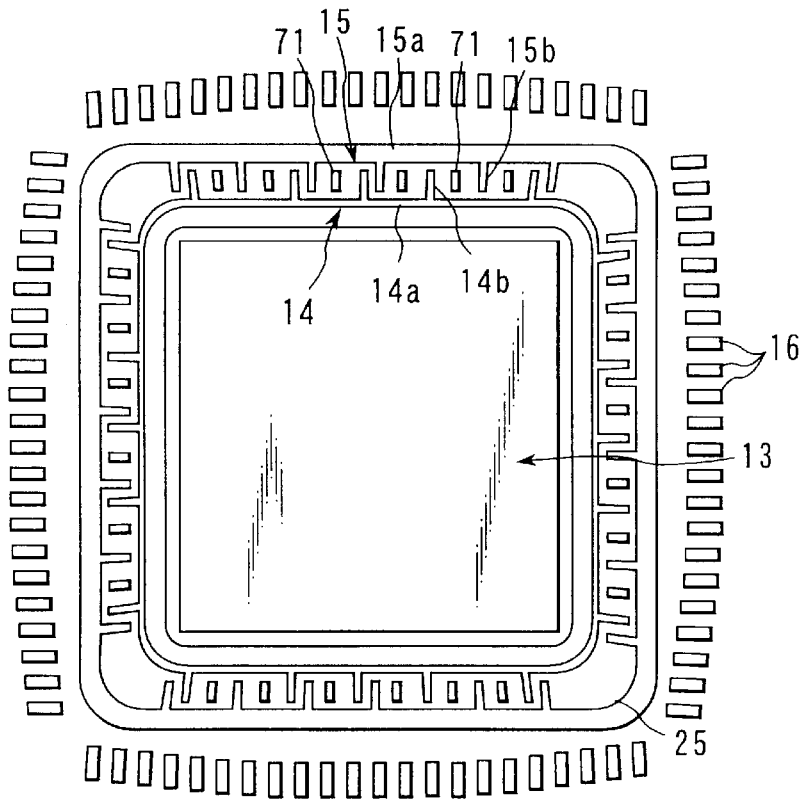
FIG. 7 is a plan view showing the essential portions of a fourth embodiment of this invention.

FIG. 7 illustrates the fourth embodiment of this invention. Like or same reference numerals are given to those components which are the same as the corresponding components of the first embodiment. According to the fourth embodiment, third interconnection patterns 71 are formed between, and isolated from, the projections 14b of the first interconnection pattern 14 and the projections 15b of the second interconnection pattern 15.

Figure 8:
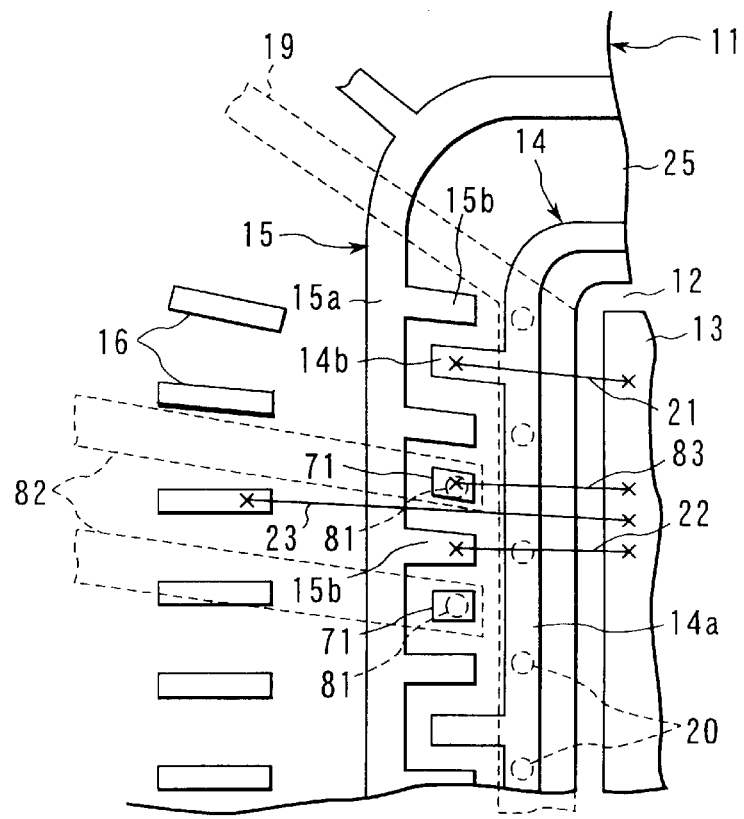
FIG. 8 is a plan view showing the essential portions of what is shown in FIG. 7.
Figure 9:
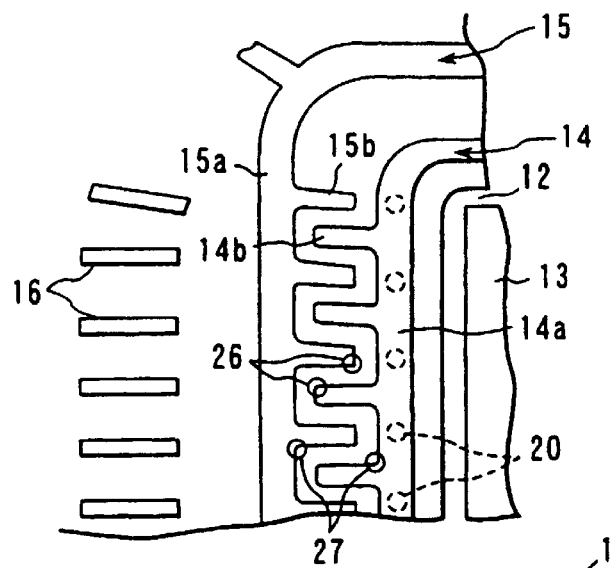
FIG. 9 is a plan view depicting the essential portions of a modification of this invention.
Figure 10:
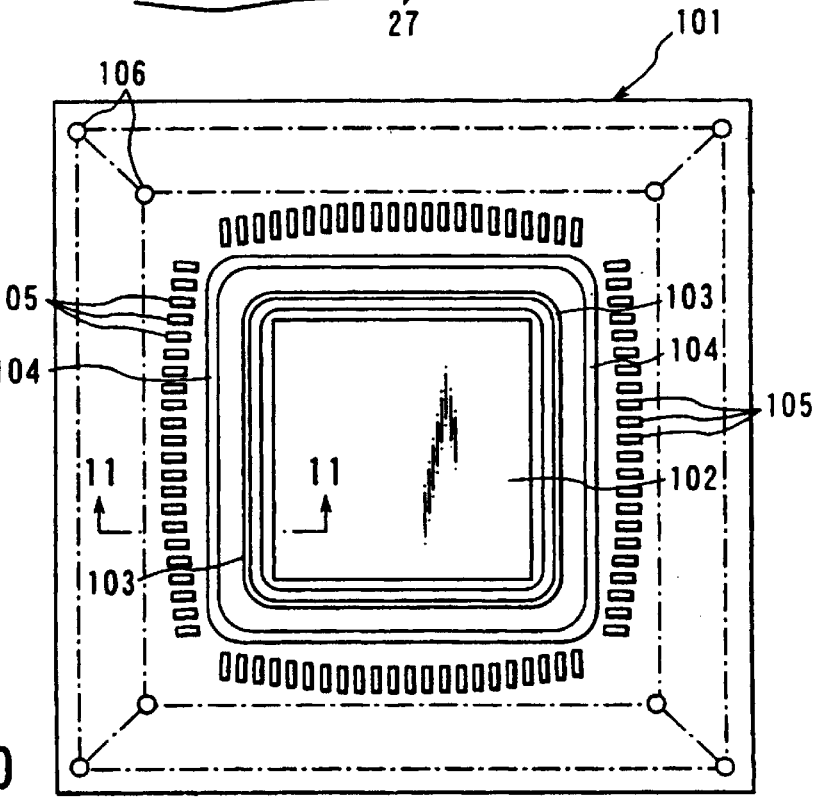
FIG. 10 is a plan view showing a conventional package for a semiconductor device.
Figure 11:
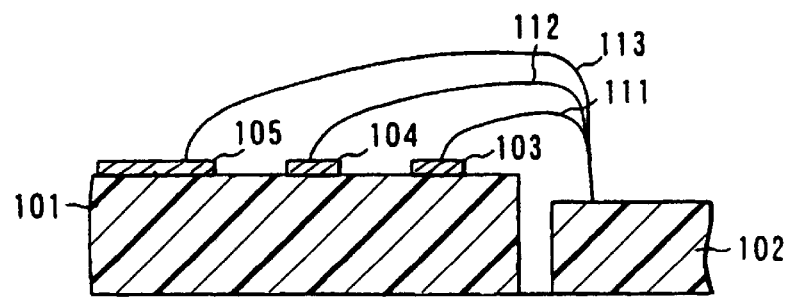
FIG. 11 is a cross-sectional view along the line 11—11 in FIG. 10.

FIG. 8 depicts the essential portions of what is shown in FIG. 7. As shown in FIG. 8, the third interconnection patterns 71 are connected to interconnection patterns 82, formed in the package body 11, via contact; portions 81 formed in the package body 11. The interconnection patterns 82 are supplied with, for example, signals. In this embodiment, the area of the interconnection pattern 19 is reduced to secure the space for the interconnection patterns 82.

According to the fourth embodiment, the third interconnection patterns 71 are formed between the first interconnection pattern 14 to which the ground potential is supplied and the second interconnection pattern 15 to which the power-supply potential is supplied. This can allow the distance between the individual interconnection patterns 71 and the associated bonding pads of the semiconductor chip 13 equal to the distances between the projections 14b and 15b of the first and second interconnection patterns 14 and 15 and the associated bonding pads of the semiconductor chip 13. It is therefore possible to use the same loop design for bonding wires 83 that are connected to the interconnection patterns 71 and the bonding wires 21 and 22 that are connected to the projections 14b and 15b. This can provide the same advantages as the first embodiment.

Further, the interconnection patterns 82 for signals can be connected to the third interconnection patterns 71 in the fourth embodiment. The third interconnection patterns 71 may be used as lines for supplying the ground potential or may be used as lines for supplying the power-supply potential. This structure can flexibly cope with different specifications of the bonding pads of the semiconductor chip 13.

Although the projections 14b and 15b of the first and second interconnection patterns 14 and 15 are formed to have sharp extremity portions and base portions in the first to fourth embodiments, their shapes are not limited to the details given above. For instance, the projections 14b and 15b of the first and second interconnection patterns 14 and 15 may have extremity portions 26 and base portions 27 formed to be round. As the base portions 27 of the projections 14b and 15b of the first and second interconnection patterns 14 and 15 are rounded, it is possible to suppress the concentration of the heat stress on the base portions 27. This can contribute to preventing cracks from being formed by such stress.

Although the projections 14b and 15b of the first and second interconnection patterns 14 and 15 all have the same shapes, the shape is not restrictive. For example, the shapes of the projections 14b and 15b corresponding to the edge portion of one side of the semiconductor chip 13 may differ from those corresponding to the edge portion of another side of the semiconductor chip 13. Treating the modified projections 14b and 15b as the bonding start positions can facilitate the position detection at the time of bonding, thus resulting in faster bonding.

The connecting relationship between the first and second interconnection patterns 14 and 15 and the bonding pads 16 and the other interconnection patterns is not limited to those of the individual embodiments discussed above. For instance, the second interconnection pattern 15 may be connected to the bonding pads 16 as shown in FIG. 1.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A package for a semiconductor device comprising:
   a substrate having a center portion on which a semiconductor chip is to be mounted;
   a first interconnection pattern formed on said substrate at a position around said semiconductor chip and having a continuous first interconnection main portion and a plurality of first projections protruding from said first interconnection main portion at approximately equal intervals;
   a second interconnection pattern formed on said substrate at a position around said semiconductor chip and spaced apart from said first interconnection pattern by a predetermined distance and having a continuous second interconnection main portion and a plurality of second projections so formed as to protrude from said second interconnection main portion at approximately equal intervals and to be engaged with said first projections of said first interconnection pattern in a non-contact manner, said second interconnection pattern being formed in a region at a same level as said first interconnection pattern; and
   a third interconnection pattern formed on said substrate at a position around said semiconductor chip, said third interconnection pattern being spaced apart from the second interconnection pattern at a predetermined distance, said third interconnection pattern being formed in a region at a same level as said first and second interconnection patterns.

2. The package according to claim 1, wherein said first and second projections of said first and second interconnection patterns are provided at approximately equal distances from a periphery of said semiconductor chip.

3. The package according to claim 1, wherein bonding portions of said first and second projections of said first and second interconnection patterns are provided at approximately equal distances from a periphery of said semiconductor chip.

4. The package according to claim 1, wherein base portions of said first and second projections of said first and second interconnection patterns are rounded.

5. The package according to claim 1, further comprising a fourth interconnection pattern provided between said first and second projections of said first and second interconnection patterns.

6. The package according to claim 5, wherein said first and second projections of said first and second interconnection patterns are provided at approximately equal distances from a periphery of said semiconductor chip.

7. The package according to claim 5, wherein bonding portions of said first and second projections of said first and second interconnection patterns are provided at approximately equal distances from a periphery of said semiconductor chip.

8. The package according to claim 5, wherein base portions of said first and second projections of said first and second interconnection patterns are rounded.

9. A package for a semiconductor device comprising:
   a substrate having a center portion on which a semiconductor chip is to be mounted;
   a first interconnection pattern formed on said substrate at a position around said semiconductor chip and having a continuous first interconnection main portion and a plurality of first projections protruding from said first interconnection main portion at approximately equal intervals;
   a plurality of second interconnection patterns formed on said substrate at a position around said semiconductor chip and laid between said first projections of said first interconnection pattern, said second interconnection patterns being formed in a region at a same level as said first interconnection pattern; and
   a third interconnection pattern formed on said substrate at a position around said semiconductor chip, said third interconnection pattern being apart from the second interconnection pattern at a predetermined distance, said interconnection pattern being formed in a region at a same level as said first and second interconnection patterns.

10. The package according to claim 9, wherein said first projections of said first interconnection pattern and said second interconnection patterns are provided at approximately equal distances from a periphery of said semiconductor chip.

11. The package according to claim 9, wherein bonding portions of said first projections of said first interconnection pattern and bonding portions of said second interconnection patterns are provided at approximately equal distances from a periphery of said semiconductor chip.

12. The package according to claim 9, wherein base portions of said first projections of said first interconnection pattern are rounded.

13. A package for a semiconductor device comprising:
   a semiconductor chip comprising first and second bonding portions at a periphery of said chip;
   a substrate comprising a center portion on which said semiconductor chip is to be mounted;

a first interconnection pattern formed on said substrate located at a position around said semiconductor chip and comprising a continuous first interconnection main portion and a plurality of first projections protruding from said first interconnection main portion at approximately equal intervals, said first projections comprising a third bonding portion;

a second interconnection pattern formed on said substrate located at a position around said semiconductor chip and being spaced apart from said first interconnection pattern at a predetermined distance, said second interconnection pattern comprising a continuous second interconnection main portion and a plurality of second projections protruding from said second interconnection main portion at approximately equal intervals and engaged with said first projection of said first interconnection pattern in a non-contact manner, said second projections comprising a fourth bonding portion;

a first bonding material coupled to said first and third bonding portions; and a second bonding material coupled to said second and fourth bonding portions, a length of second bonding material being substantially equal to a length of said first bonding material.

14. The package according to claim 13, wherein a base portion of said first and second projections of the first and second interconnection patterns has a round shape.

15. The package according to claim 13, further comprising a third interconnection pattern provided between said first and second projections of the first and second interconnection patterns.

16. The package according to claim 15, wherein a base portion of said first and second projections of the first and second interconnection patterns has a round shape.

17. A package for a semiconductor device comprising:

a semiconductor chip comprising first and second bonding portions at a periphery of said chip;

a substrate comprising a center portion on which said semiconductor chip is to be mounted;

a first interconnection pattern formed on said substrate at a position around said semiconductor chip and comprising a continuous first interconnection main portion and a plurality of first projections protruding from said first interconnection main portion at approximately equal intervals, said first projections comprising a third bonding portion;

a plurality of second interconnection patterns comprising a fourth bonding portion and provided between each of the first projections of said first interconnection pattern on said substrate at a position around said semiconductor chip;

a first bonding material coupled to said first and third bonding portions; and a second bonding material coupled to said second and fourth bonding portions, a length of said second bonding material being substantially equal to a length of said first bonding material.

18. The package according to claim 17, wherein a base portion of said first and second projections of the first and second interconnection patterns has a round shape.

* * * * *